United States Patent [19]
Hu et al.

[11] Patent Number: 5,905,020
[45] Date of Patent: May 18, 1999

[54] METHOD AND APPARATUS FOR REDUCING THE CRITICAL DIMENSION DIFFERENCE OF FEATURES PRINTED ON A SUBSTRATE

[75] Inventors: Bernie B. Hu, Beaverton; Robert F. Hainsey, Portland; Jeffrey G. Lewis, Hillsboro, all of Oreg.

[73] Assignee: Intel Corporation, Santa Clara, Calif.

[21] Appl. No.: 08/769,469

[22] Filed: Dec. 20, 1996

[51] Int. Cl.$^6$ ....................................................... G03F 5/00
[52] U.S. Cl. ........................... 430/394; 430/397; 430/312; 250/492.2
[58] Field of Search ..................................... 430/311, 394, 430/396, 312, 397; 250/492.2

[56] References Cited

U.S. PATENT DOCUMENTS

| | | | |
|---|---|---|---|
| 5,281,996 | 1/1994 | Bruning et al. | 355/77 |
| 5,503,959 | 4/1996 | Langston | 430/394 |

FOREIGN PATENT DOCUMENTS

| | | | |
|---|---|---|---|
| 1-1258419 | 10/1989 | Japan | 430/397 |
| 3-1522 | 1/1991 | Japan . | |

OTHER PUBLICATIONS

Silicon Processing For The VLSI Era, vol. 1–Process Technology, S. Wolf and R.N. Tauber, pp. 407–492.

"Product Description for the Micrascan II", pp. 1–1–4–4, Nov. 11, 1994.

"The Ultimate Lithography Solution For 0.5 $\mu$m to 0.25 $\mu$m", 4 pages, 1992.

*Primary Examiner*—Kathleen Duda
*Attorney, Agent, or Firm*—Blakely, Sokoloff, Taylor & Zafman

[57] ABSTRACT

A method and apparatus for printing vertically and horizontally aligned features having reduced, substantially equal, critical dimensions on a photoresist-coated semiconductor wafer are disclosed. Radiant energy is passed through a pattern transfer tool to irradiate a first region of the wafer when the wafer is at a first position relative to the pattern transfer tool. The wafer is then positioned at a second position relative to the pattern transfer tool offset from the first position by a first distance along an axis aligned with the horizontal features and by a second distance along an axis aligned with the vertical features. The second distance is different from the first distance by a compensation distance. Radiant energy is then passed through the pattern transfer tool to irradiate a second region of the wafer region defining a second side of each of the horizontally and vertically aligned features.

14 Claims, 16 Drawing Sheets

METHOD AND APPARATUS FOR REDUCING THE CRITICAL DIMENSION DIFFERENCE OF FEATURES PRINTED ON A SUBSTRATE

BACKGROUND OF THE INVENTION (1) Field of the Invention

The present invention relates to the field of microcircuit fabrication. More specifically, the present invention relates to a method and apparatus for microlithographic printing.

(2) Art Background

Microlithographic Process

FIG. 1A illustrates a microlithographic printing process. A pattern transfer tool 130 is interposed between a source of radiant energy 105 and a semiconductor wafer 101. The semiconductor wafer 101 includes a film 110 disposed between a semiconductor substrate 100 and a layer of photoresist 120. Herein, film 110 is described as being a layer of polysilicon 110, but may also be a metal, an interlayer dialectric (ILD) or any other film in which features are to be patterned. The pattern transfer tool 130, which may be a mask or reticle, includes a pattern 135 of opaque regions 131 and 132 disposed thereon. Radiant energy 105 striking the pattern transfer tool 130 is blocked at opaque regions 131 and 132, but otherwise passes through the pattern transfer tool to irradiate regions in the photoresist layer 120 of the wafer 101. As FIG. 1A illustrates, the effect of exposing the wafer 101 to radiant energy 105 through the pattern transfer tool 130 is to irradiate regions of the photoresist layer 120 in a pattern defined by the opaque regions 131 and 132 on the pattern transfer tool 130. The features defined by opaque regions 131 and 132 on the pattern transfer tool 130 are said to be "printed" on the wafer surface and the process of exposing the photoresist-coated wafer 101 to radiant energy 105 is referred to herein as "printing".

The photoresist of layer 120 includes a photoactive compound which chemically reacts when exposed to radiant energy, typically actinic light. In one type of photoresist, known as negative photoresist, irradiation induces a "crosslinking" chemical reaction to render the irradiated regions in the photoresist insoluble in a solvent called "developer". After application of developer, referred to as the "development step", non-irradiated regions 121 and 122 of photoresist layer 120 are removed. Consequently, the pattern formed in the negative photoresist layer is the negative of the pattern defined by the opaque regions 131 and 132 of the pattern transfer tool 130.

FIG. 1B illustrates the state of the semiconductor wafer 101 after irradiation and development of a positive photoresist. Irradiation of positive photoresist induces a chemical reaction to render the irradiated regions of the positive photoresist soluble in developer. As FIG. 1B illustrates, after the development step, only regions 121 and 122 remain of the photoresist layer 120 depicted in FIG. 1A. Thus, the pattern formed in the positive photoresist is a positive image of the opaque regions 131 and 132 on the pattern transfer tool 130 of FIG. 1A. Due to resolution limitations inherent in presently available negative photoresist materials, positive photoresist is used almost exclusively in microlithographic printing of submicron features. For this reason, the present invention is discussed primarily in terms of microlithographic printing in positive photoresist. It will be appreciated, however, that the apparatus and method of the present invention may be used to print features in either positive or negative photoresist.

After the wafer has been developed to the state shown in FIG. 1B, an etching compound is applied to etch away the regions of polysilicon layer 110 not covered by the remaining regions of photoresist 121 and 122, thereby revealing regions of the substrate 100. The result, shown in FIG. 1C, is a reproduction of the image on the pattern transfer tool in the polysilicon layer (element 110 of FIGS. 1A and 1B). At this point, the remaining photoresist regions 121 and 122 can be stripped away leaving only features 111 and 112 in what was the polysilicon layer 110 of FIGS. 1B and 1A. When surrounded by wells of appropriately doped substrate, the polysilicon features 111 and 112 define gates of field-effect transistors (FET).

The Critical Dimension

The minimum width of an isolated line that can be printed by a microlithographic process, referred to as the "critical dimension", is one of the process's most important characteristics. The smaller the isolated linewidth, the narrower the FET gate that can be formed. Since a FET's maximum switching frequency and area-density both increase as the gate is narrowed, the ability to reduce the width of the isolated line translates directly into the ability to produce faster, more densely populated integrated circuits.

Microlithographic Printing Machines

Microlithographic printing is performed by a machine known as an "aligner" for its ability to align a wafer to a pattern transfer tool. The manner in which the wafer is aligned to the pattern transfer tool depends on whether the pattern transfer tool is a mask or a reticle. If the pattern transfer tool is a mask, the wafer is aligned to the mask once, then all of the wafer die are exposed at the same time. However, if the pattern transfer tool is a reticle, the reticle pattern is transferred to only one (or a few) wafer die per exposure. After each exposure, a stage to which the wafer is mounted is stepped to align the next die for exposure through the reticle and the print is repeated. Such aligners are referred to as "step and repeat aligners," "steppers" or, in some cases, "scanners" (a scanner is stepper in which exposure through the reticle is achieved by scanning the reticle with the radiant energy source. Herein, the term stepper is used to mean any step and repeat device, including a scanner). Since the step and repeat print process must be performed potentially as many times as there are die in the wafer, the step and repeat process is considerably more time consuming than a single-exposure mask process. However, since a much smaller area of the wafer is printed per exposure, the reticle pattern may be an enlargement of the pattern to be printed and therefore easier to fabricate. Also, stepping each die allows wafer distortion to be compensated on a die by die basis.

Modern microlithographic printers are said to be diffraction limited. That is, diffraction of light passing through clear regions within a pattern transfer tool such as a mask or reticle, and not defects in the elements of the optical path, limit the minimum isolated linewidth achievable with a given machine. Radiation spreads out from the individual slits on the pattern transfer tool to regions on the wafer that are not intended to be exposed. At some point, the slits, or clear regions, of the pattern transfer tool become so close together that their resultant images cannot be resolved on the wafer surface. The minimum distance between pattern transfer tool features has been shown to be proportional to the wavelength of light used to irradiate the wafer and inversely proportional to the numerical aperture (NA) of the objective lens used to collect light diffracted from the pattern transfer tool and focus it onto the wafer.

Reducing minimum feature size by increasing the NA of the objective lens is difficult and involves tradeoffs in other aspects of the fabrication process. The depth of focus of a lens, for example, is inversely proportional to the square of the lens NA so that increased NA results in exponentially decreased depth of focus. If the depth of focus becomes too small, variations in wafer flatness can render regions of the wafer outside the focal plane. Aside from the depth of focus problem, increased lens NA generally requires a larger diameter lens, meaning that lens NA can be increased only up to a practical limit.

Reducing minimum feature size by shifting the irradiating wavelength deeper into the UV region also presents difficulties. As the irradiating wavelength is shortened, the brightness of existing light sources is severely reduced and the optical elements in the printer absorb more of the energy passing through them. As a consequence, the total energy incident on the resist is reduced. Longer exposure times are required resulting in reduced throughput.

Since the irradiating wavelength and the lens NA are generally fixed for a given printer, the printer is subject to rapid obsolescence as feature sizes shrink. Consequently, printers incorporating the latest technology and purchased at enormous cost may become unable to support fabrication of flagship products within just a few years.

Systematic Difference in Critical Dimension

It is common for features printed using a particular microlithographic printing process to exhibit systematic differences in critical dimension. The systematic critical dimension difference is usually most noticeable between horizontally and vertically aligned features and typically ranges from 10 to 30 nm. For features having critical dimensions greater than roughly one micron, a 10–30 nm critical dimension difference can be ignored. As feature critical dimensions drop below one micron, however, a 10–30 nm vertical/horizontal critical dimension difference begins to be substantial. Since, as stated above, device characteristics are fundamentally affected by the critical dimension of polysilicon gates, a substantial difference in critical dimension results in a noticeable performance inequality between vertically and horizontally aligned features.

It would be desirable, therefore, to provide a method and apparatus for printing horizontally and vertically aligned features on a semiconductor wafer having reduced, substantially equal, critical dimensions.

BRIEF SUMMARY OF THE INVENTION

A double shift print including a compensation shift is employed to print horizontally and vertically aligned features having reduced, substantially equal, critical dimensions on a semiconductor wafer. The semiconductor wafer is positioned at a first position relative to a pattern transfer tool so that, when exposed to radiant energy through the pattern transfer tool in a first exposure, a first region of the wafer is exposed that defines some, but not all, sides of the features. Next, the wafer is positioned at a second position relative to the pattern transfer tool so that, when exposed to radiant energy through the pattern transfer tool in a second exposure, a second region of the wafer is exposed that defines the remaining sides of the features. The second position is offset from the first position by a first distance along a first, horizontally aligned, axis and by a second distance along a second, vertically aligned, axis. The first axis is normal to the second axis. The second distance is different from the first distance by a compensation distance, and the compensation distance is based on a previously determined systematic difference between the critical dimensions of vertically and horizontally aligned features.

By adjusting the second distance by the compensation distance, the systematic difference between the critical dimensions of vertically and horizontally aligned features can be substantially reduced.

An apparatus for performing a double shift print including a compensation shift includes a source mount to receive a radiant energy source, a pattern mount to receive a pattern transfer tool, a stage having a wafer mount to receive a semiconductor wafer, and a stage positioner coupled to drive the stage. The source mount, pattern mount and stage are disposed relative to one another such that radiant energy from a radiant energy source mounted in the source mount passes through a pattern transfer tool mounted in the pattern mount and is received on a wafer mounted on the stage. In one embodiment, the stage positioner drives the stage to a first position to expose a first region of the wafer to radiant energy passing through the pattern transfer tool, then to a second position to expose a second region of the wafer to radiant energy passing through the pattern transfer tool. The first and second regions each partially define a plurality of vertically and horizontally aligned features. The second position is offset from the first position by a first distance along an axis aligned with the horizontally aligned features and by a second distance along an axis aligned with the vertically aligned features. To reduce a systematic difference between the critical dimensions of the vertically and horizontally aligned features, the second distance is different from the first distance by a compensation distance.

In an alternative embodiment of the apparatus for performing a double shift print, a pattern transfer tool actuator is provided to move the pattern transfer tool after the exposure of the first region of the wafer. The travel of the pattern transfer tool can be precisely controlled so that, after the first region is exposed to radiant energy, activation of the radiant energy source can be maintained while the pattern transfer tool is moved to expose the second region of the wafer. The pattern transfer tool is moved between first and second positions that are offset from one another by a first distance along an axis aligned with horizontally patterned features and by a second distance along an axis aligned with vertically patterned features. To reduce a systematic difference in critical dimension between the horizontally and vertically aligned features, the second distance differs from the first distance by a compensation distance.

In yet another embodiment of the apparatus for performing a double shift print, a dual-reticle pattern transfer tool is employed to expose two wafer die at once. The dual-reticle pattern transfer tool includes two reticles having essentially identical patterns thereon, but with each pattern being offset from the center of its respective reticle in a direction opposite the other. By exposing a die first to radiant energy passed through one of the two reticles, and then to radiant energy passed through the other of the two reticles, a double shift print is achieved. Since, except in the case of a perimeter die, two die are exposed after each repositioning of the wafer relative to the pattern transfer tool, the total number of repositioning steps is significantly reduced compared to the number of repositioning steps required in a single-reticle pattern transfer tool.

DETAILED DESCRIPTION OF THE INVENTION

A method and apparatus for printing vertically and horizontally aligned semiconductor wafer features having reduced, substantially equal, critical dimensions are described below. Although numerous specific details are set forth in order to provide a thorough understanding of the present invention, it will be apparent to one skilled in the art that the present invention may be practiced without such specific details.

Figure 1A:
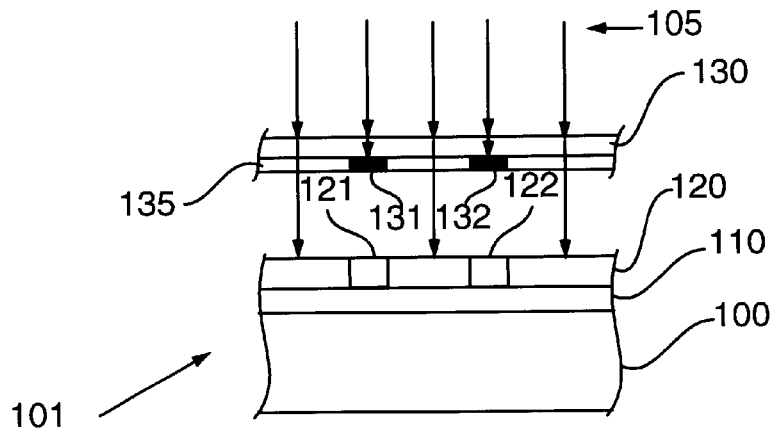
FIG. 1A illustrates the exposure step of a microlithographic process according to the prior art.
Figure 1B:
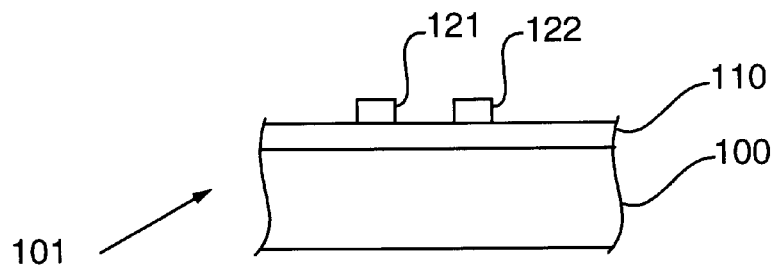
FIG. 1B illustrates a semiconductor wafer after the development step of a microlithographic process according to the prior art.
Figure 1C:
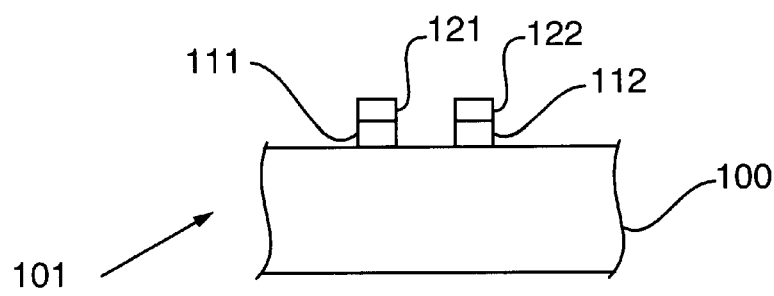
FIG. 1C illustrates a semiconductor wafer after the etching step of a microlithographic process according to the prior art.
Figure 2A:
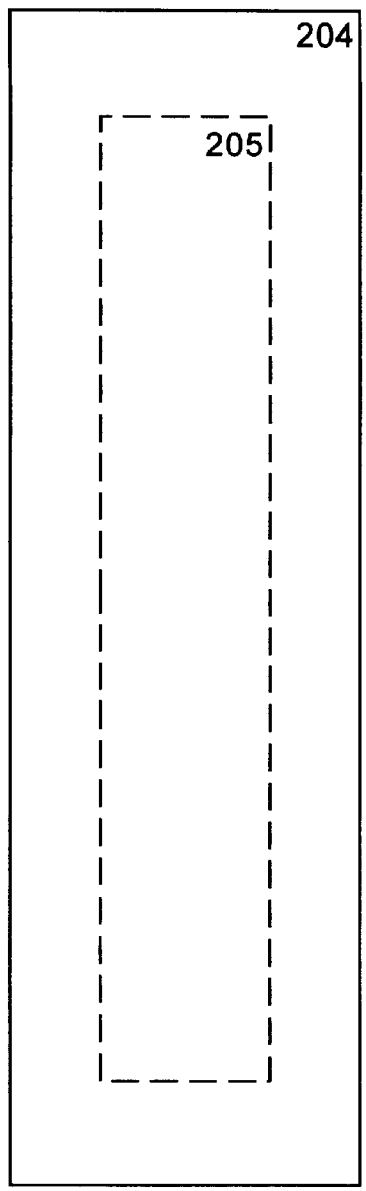
FIG. 2A illustrates the relationship between a feature printed using prior art techniques and a feature printed according to the present invention.

FIG. 2A depicts a feature 204 having a critical dimension that can be achieved using prior art techniques and a given optical system. Feature 205, indicated by a dashed line, has a yet smaller critical dimension and can be achieved by the method and apparatus of the present invention, but using an optical system having the same limitations as that used to print feature 204.

Figure 2B:
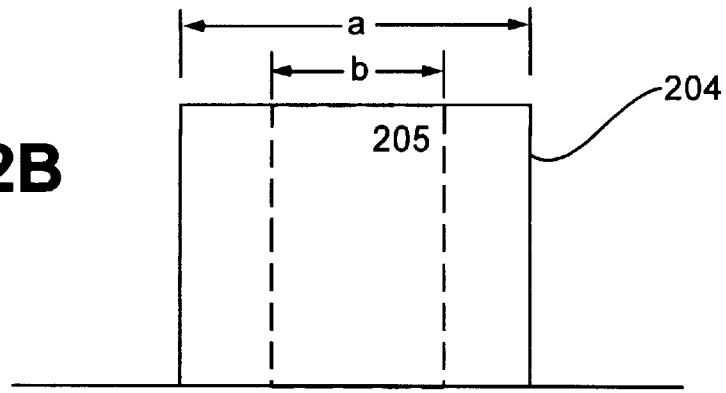
FIG. 2B depicts a profile view of the features shown in FIG. 2A.

FIG. 2B depicts a profile view of features 204 and 205 to emphasize their respective critical dimensions, "a" and "b".

Diffraction effects limit the critical dimension achievable with prior art techniques to dimension "a", while the double shift print of the present invention can be used to reduce the critical dimension to "b".

Method for Performing a Double Shift Print

Figure 3:
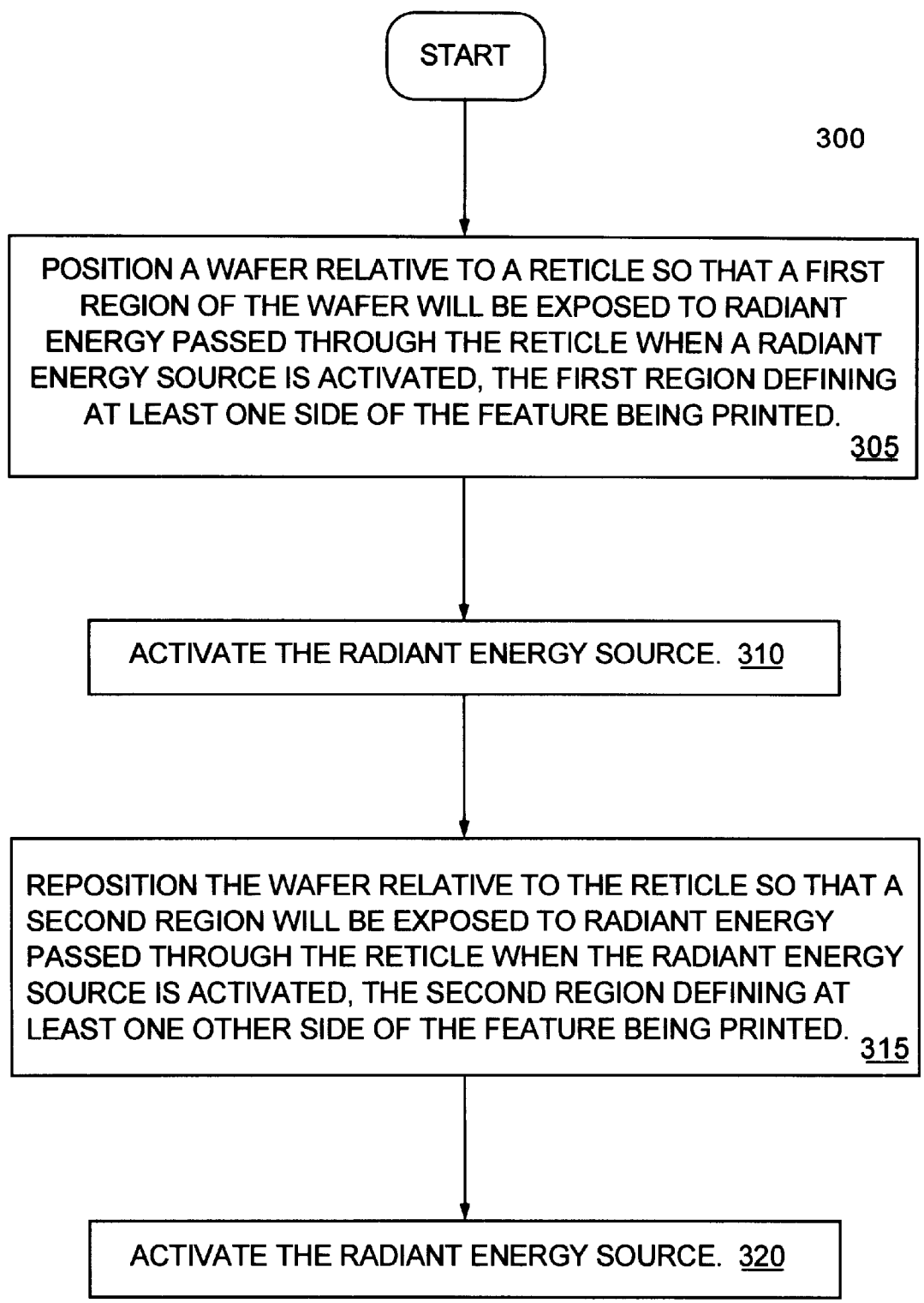
FIG. 3 illustrates a method according to the present invention.

FIG. 3 illustrates a method 300 for printing a feature on a photoresist-coated semiconductor wafer according to the present invention. The geometry of the feature to be printed is defined by an opaque region on a pattern transfer tool such as a mask or reticle. To simplify the concepts involved in the following description, the opaque region on the pattern transfer tool, and hence the feature to be printed on the wafer, is assumed to be a rectangle. Nevertheless, it will be readily appreciated that a variety of feature geometries can be printed with the method of the present invention. Also, though a reticle is discussed below, the pattern transfer tool may be a mask or any other tool for transferring an image thereon to an object wafer.

First Shift and Exposure

At step 305 of method 300 the wafer is positioned at a first position relative to the reticle so that a first region of the wafer will be exposed to radiant energy passed through the reticle. An opaque rectangle on the reticle defines the first region so that, when the radiant energy source is activated at step 310, the wafer is exposed in a pattern defining a first non-exposed rectangular region and also defining two sides of the feature being printed.

Figure 4:
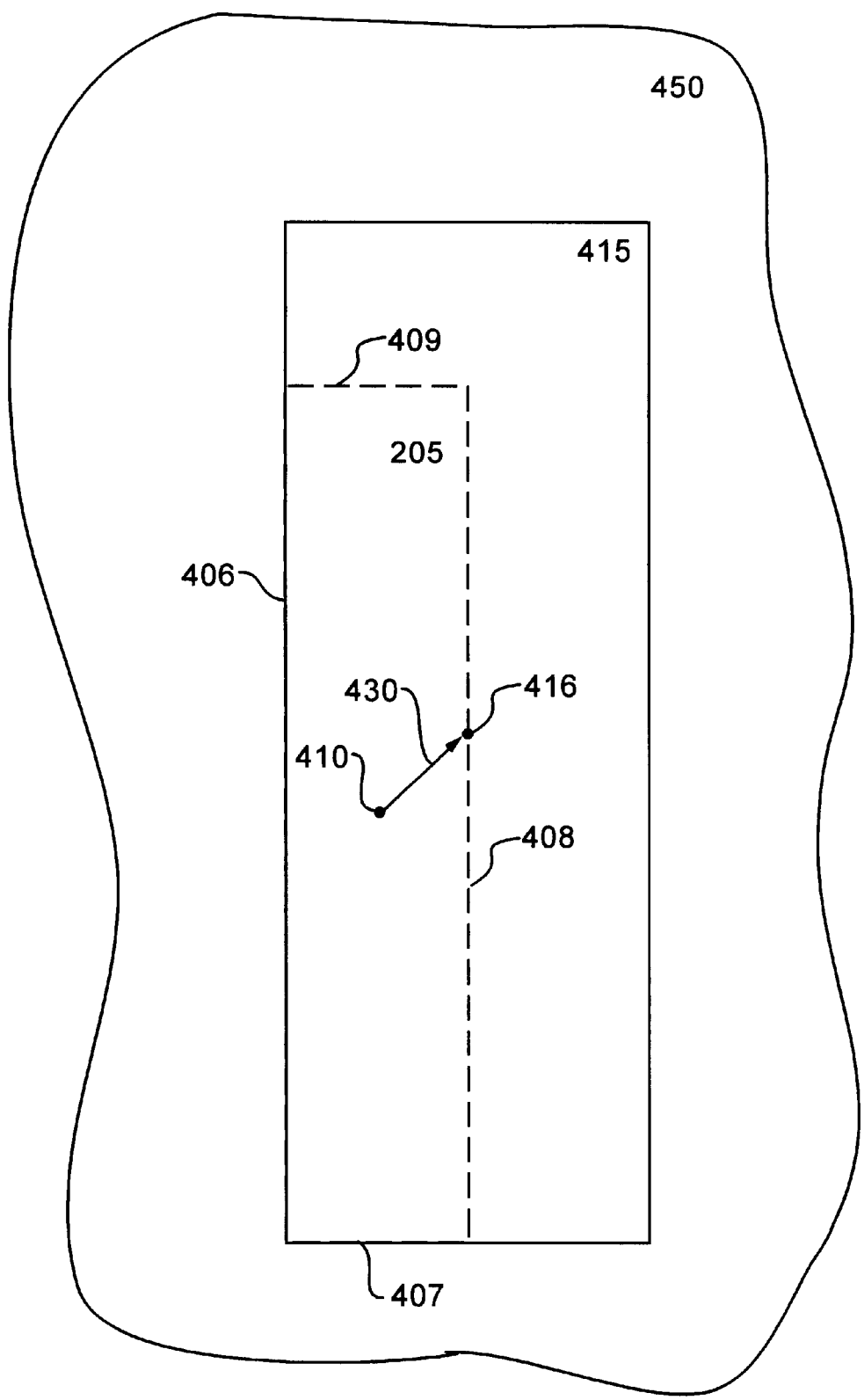
FIG. 4 illustrates the configuration of exposed and non-exposed regions on a semiconductor wafer resulting from a print at a first shifted position.

FIG. 4 depicts the configuration of the wafer regions described above after step 310 of method 300 has been performed. If developer is applied to the wafer at this point, photoresist in the first exposed region 450 will be removed leaving the first non-exposed region 415. As FIG. 4 illustrates, the non-exposed region 415 includes the feature being printed 205. Sides 406 and 407 of feature 205 are defined by sides of the non-exposed region 415. It will be appreciated that, since the exposed region 450 defines the non-exposed region 415, the exposed region 450 can also be said to define sides 406 and 407 of the feature 205. Sides 408 and 409 of feature 205 are shown as dotted lines to emphasize that they have not yet been defined by an exposure.

One skilled in the art will appreciate that, due to diffraction effects, non-exposed region 415 will be at least partly exposed to radiant energy. However, because the energy dosage is insufficient to render region 415 soluble in developer, region 415 is considered to be substantially unexposed and referred to for convenience as a non-exposed region.

It is significant that non-exposed region 415 is not centered over feature 205 as it would be in a usual lithographic printing process. The non-exposed region 415 is said to be "offset" from the feature 205 by the distance and direction indicated by vector 430. Thus, vector 430, which extends from the area-centroid 410 of feature 205 to the area-centroid 416 of non-exposed region 415, represents a positional shift of non-exposed region 415 relative to the feature 205 being printed. It will be appreciated that, depending on the previous position of the wafer relative to the reticle, the positional shift represented by vector 430 and the motion necessary to position the wafer in step 305 of method 300 are not necessarily the same. In any case, the positional shift represented by vector 430 is the first positional shift of a double shift print.

Second Shift and Exposure

Returning to method 300 of FIG. 3, at step 315 the wafer is repositioned relative to the reticle so that a second region of the wafer will be exposed to radiant energy passed through the reticle. At step 320, the wafer is exposed in a pattern defining a second non-exposed region and also defining the remaining sides of the feature being printed. It will be appreciated that the second non-exposed region is only a non-exposed region insofar as the exposure at step 320 is concerned. That is, the second non-exposed region includes a subregion exposed during exposure step 310. Similarly, the first non-exposed region, discussed above in reference to exposure step 310, includes a subregion exposed during exposure step 320.

Figure 5:
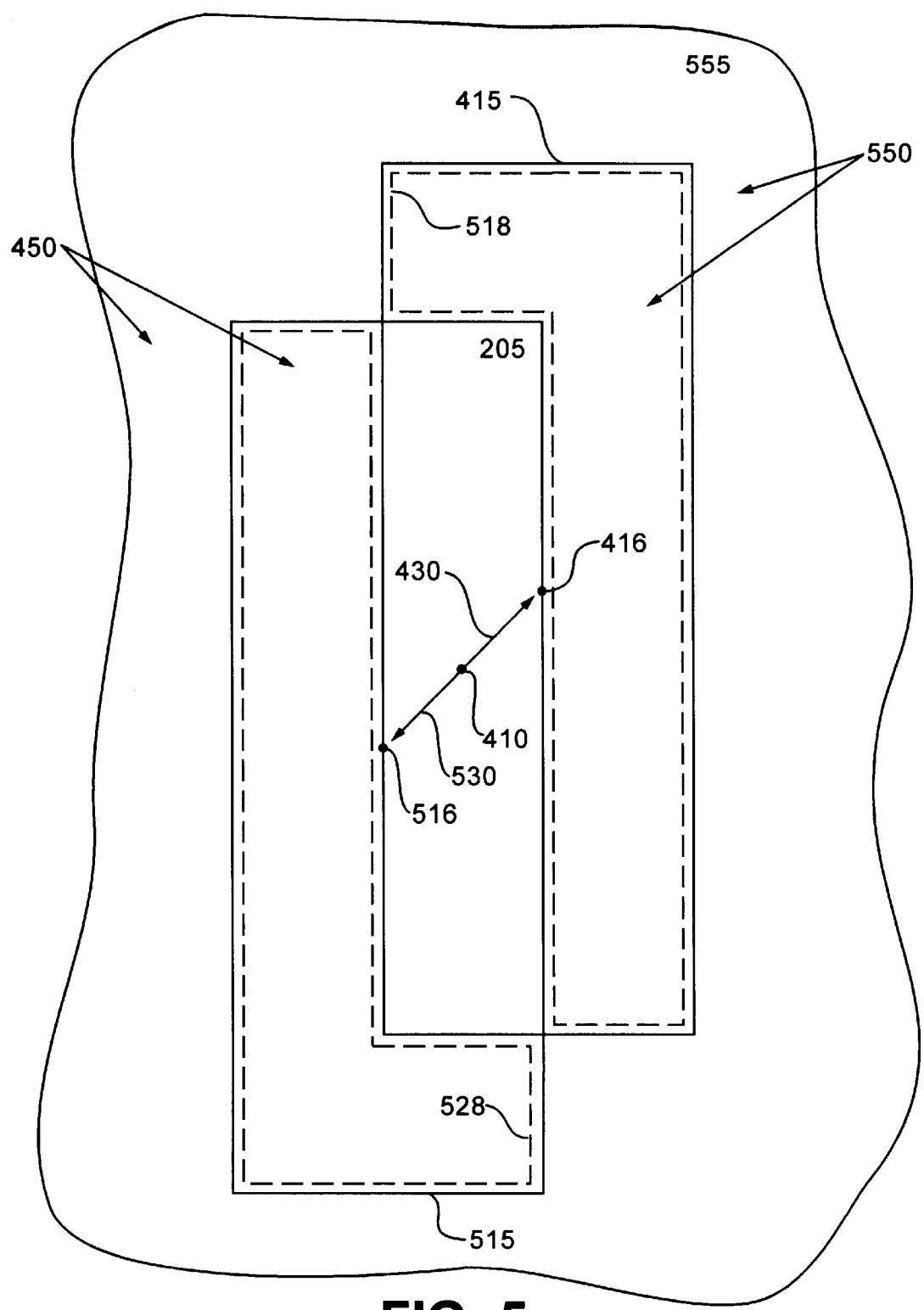
FIG. 5 illustrates the configuration of exposed and non-exposed regions on a semiconductor wafer resulting from a print at a second shifted position.

FIG. 5 depicts the configuration of the various wafer regions after step 320 of method 300 is performed. The first exposed region 450, resulting from exposure step 310, includes region 555 and an exposed subregion 528 of second non-exposed region 515. The second exposed region 550, resulting from exposure step 320, includes region 555 and an exposed subregion 518 of first non-exposed region 415. Thus, feature 205 is fully defined by exposed subregions 518 and 528, or, said another way, by the overlapping of first non-exposed region 415 by second non-exposed region 515. After developer is applied to dissolve the exposed photoresist regions, feature 205 will remain.

As stated above, vector 430 extends from the area-centroid 410 of feature 205 to the area-centroid 416 of non-exposed region 415 and represents the first positional shift of a double shift print. Similarly, vector 530 extends from the area-centroid 410 of feature 205 to the area centroid 516 of non-exposed region 515 and represents the second positional shift of the double shift print. Again, vectors 430 and 530 represent positional shifts of non-exposed regions 415 and 515 relative to the feature 205 being printed and are not necessarily indicative of movements necessary to position the wafer relative to the reticle. The movement of the wafer (or reticle) to successive exposure positions is discussed in more detail below in reference to FIG. 8.

In one embodiment of the present invention, the positional shifts represented by vectors 430 and 530 depicted in FIG. 5 are ideally of equal magnitude and opposite direction. Of course, since actual positioning systems have finite accuracy, positional shifts of substantially equal magnitude and substantially opposite direction must suffice (e.g., error less than 10%).

Magnitude of the Positional Shifts of a Double Shift Print

In practice, the magnitude of the positional shifts indicated by vectors 430 and 530 of FIG. 5 will depend on the critical dimension sought to be achieved by the double shift print and the resolution of the printer. In the context of a microlithographic printer, "resolution" refers to the critical dimension of a feature that can be printed in a single exposure during which the position of the wafer relative to the reticle remains fixed.

Figure 6:
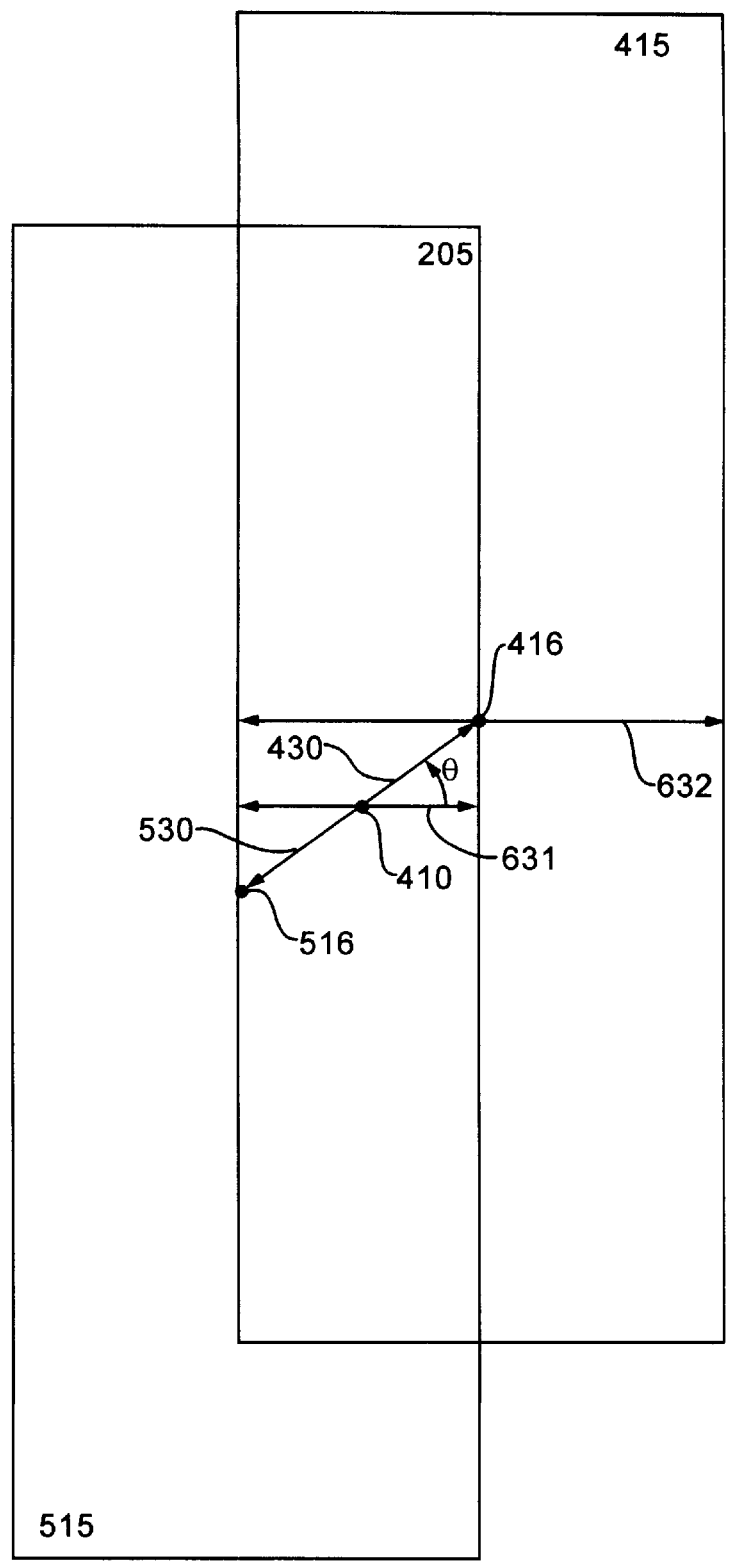
FIG. 6 illustrates the geometric relationships used to determine the magnitude of the first and second positional shifts.

FIG. 6 illustrates the geometric relationships used to determine the magnitude of the first and second positional shifts of a double shift print. First, to produce a feature having a critical dimension indicated by line 631 with a printer having a resolution indicated by line 632, each positional shift must have a component parallel to line 631 given by:

$$X=(R-CD)/2 \tag{1}$$

where X is the component of the positional shift parallel to an X-axis defined by line 631, R is the resolution of the printer indicated by line 632 and CD is the critical dimension of the feature sought to be printed indicated by line 631. If A is the magnitude of vector 430, and θ is the angle between vector 430 and line 631, then the relationship between the magnitude of vector 430 and X is:

$$X = A \cos(\theta) \tag{2}$$

Equations (1) and (2) can now be combined to solve for A:

$$A=(R-CD) / (2^* \cos(\theta)) \tag{3}$$

In order to achieve a precise critical dimension, it has been found necessary to adjust the magnitude of the positional shift to account for such process factors as the contrast of the photoresist and the degree of photoresist swelling during development. In practice, a compensation factor for a given process, K, is empirically determined based on the critical dimension sought. In most cases K falls within the range 0.8 to 1.8. When the compensation factor, K, is included in equation (3), the expression for the magnitude of the positional shift indicated by vectors 430 and 530 becomes:

$$A=K * (R-CD) / (2 *\cos(\theta)) \tag{4}$$

In order to equally reduce the critical dimension of horizontally and vertically aligned features, the angle θ is usually chosen so that the positional shift can be resolved into equal X and Y-axis components (i.e., θ=π/4 (or 3π/4) radians). As will be discussed below, θ may be adjusted somewhat to provide a compensation shift, but when no compensation shift is to be introduced, the expression for the magnitude of each positional shift reduces to:

$$A=K^*(R-CD)/\sqrt{2} \tag{5}$$

To apply the equations developed above, consider, for example, the Nikon Body-11 i-line stepper which prints with 365 nm light (the "i-line" of a mercury-vapor lamp) and has a resolution of 370 nm. A feature having a critical dimension at least as low as 200 nm can be achieved by reconfiguring the printer to perform a double shift print with the magnitude of each positional shift being 1.5 * (370−200)/√2=180 nm (1.5 being the empirically determined compensation factor and assuming no compensation shift).

Likewise, a DUV (deep ultraviolet) stepper having a resolution of approximately 248 nm can be reconfigured to double shift print a feature having a critical dimension at least as low as 150 nm. In such a case, the magnitude of each positional shift is: 1.4 * (248−150) /√2=97 nm (again, 1.4 being the empirically determined compensation factor and assuming no compensation shift). A 193 nm resolution DUV stepper can be reconfigured to double shirt print a feature having a critical dimension at least as low as 100 nm. In that case, the magnitude of each positional shift is: 1.4 * (193−100) /√2=92 nm. Thus, by reconfiguring a printer to perform a double shift print and without changing any element of the optical system, including the reticle, a substantially reduced critical dimension can be achieved.

Based on equation (4), it will be appreciated that, for a printer having a given resolution, R, the magnitude of the positional shift, A, increases as the critical dimension, CD, decreases. The maximum positional shift occurs as the critical dimension, CD, approaches zero and θ equals π/4 radians. In that case, the magnitude of the positional shift, A, is given by: A=K * R /√2. Since, when a wafer is positioned at a first shifted position for a first exposure and then repositioned to a second shifted position for a second exposure, the distance between the first and second shifted positions is 2*A (assuming oppositely directed positional shifts), the maximum distance between the first and second shifted positions will generally be less than K*R*√2.

Compensation Shift

Figure 14:
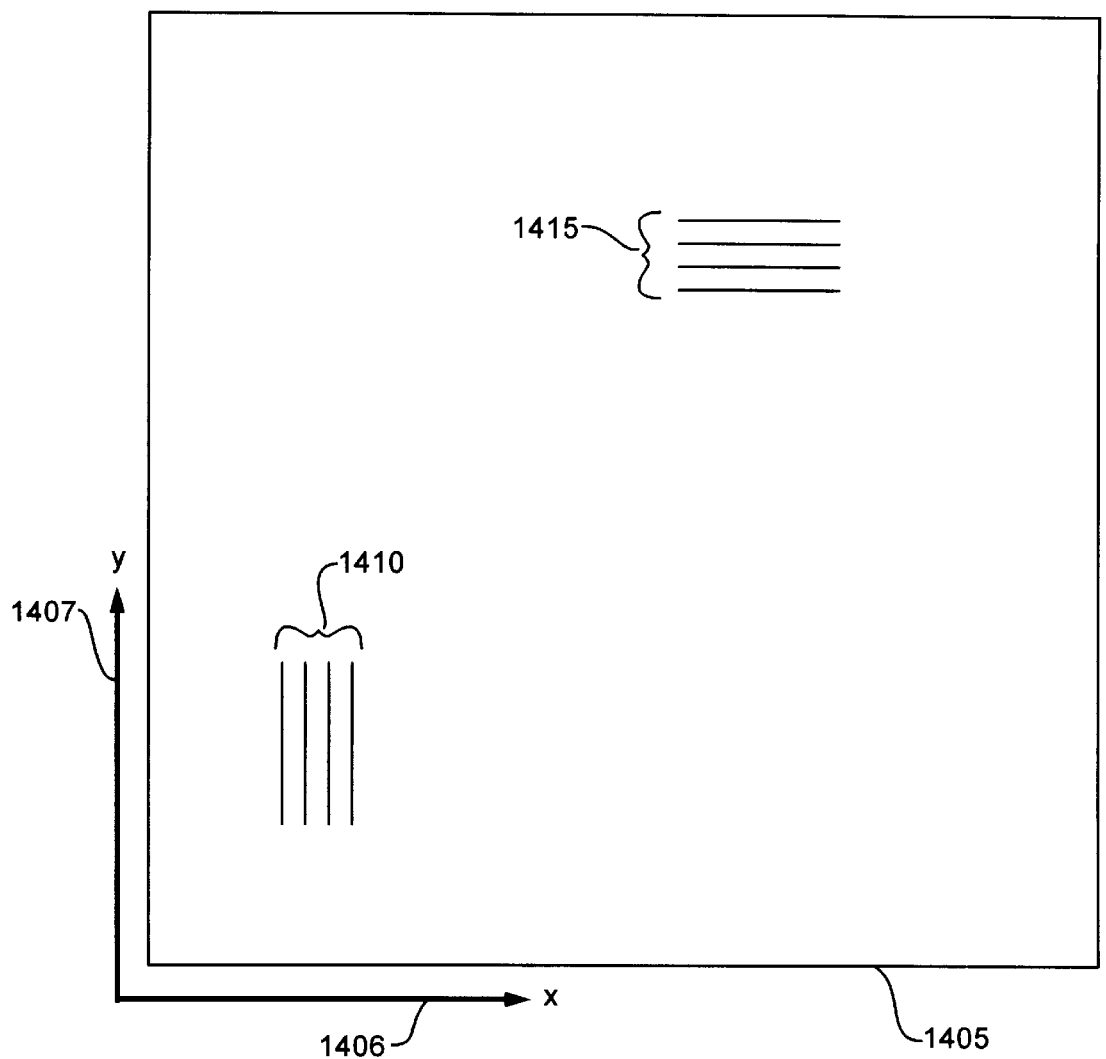
FIG. 14 illustrates a wafer die having vertically and horizontally aligned features printed thereon.

FIG. 14 illustrates a wafer die 1405 on which a number of horizontally aligned features 1415 and vertically aligned features 1410 have been printed. Horizontal alignment refers to longitudinal alignment of a feature with an axis substantially parallel to an edge of the wafer die 1405. Vertical alignment refers to longitudinal alignment of a feature with an axis normal (orthogonal) to the axis of horizontal alignment. For example, horizontal features 1415 are longitudinally (lengthwise) aligned with horizontal axis (X-axis) 1406. Likewise, vertical features 1410 are longitudinally aligned with vertical axis (Y-axis) 1407.

Due to orientation-dependent process steps such as wafer positioning, photoresist spin-coating and etching, vertical features 1410 and horizontal features 1415 tend to exhibit a systematic difference in critical dimension. This difference, referred to as a "vertical/horizontal CD difference", typically ranges from 15 to 30 nm and becomes performance limiting as feature critical dimensions fall below approximately 200 nm. The vertical/horizontal CD difference can be expressed analytically as:

$$\Delta_{V/HCD} = X_{mean} - Y_{mean} \tag{6}$$

where $X_{mean}$ is the mean of critical dimensions of horizontally aligned features and $Y_{mean}$ is the mean of critical dimensions of vertically aligned features.

In the present invention, the vertical/horizontal CD difference is reduced by introducing a "compensation shift" in each of the positional shifts of the double shift print. A compensation shift is a difference between the magnitudes of the component vectors of a positional shift. For example, if each of the positional shifts are expressed in terms of their components along axes of an X-Y coordinate system defined by an edge of a wafer die, the positional shifts would be:

First shift: x=a, y=a, where a represents component magnitude

Second shift: x=−a, y=−a

Of course, the first shift could be given by (x=a, y=−a) or (x=−a, y=a) with the second shift being determined by multiplying values x and y of the first shift by negative one. Now, a double shift print including a compensation shift may be expressed as follows:

First shift: x=a, y=a−cs, where cs is the compensation shift

Second shift: x=−a, y=−a+cs

Of course the sign of the compensation shift, cs, could be positive or negative depending on whether an increased or reduced critical dimension is desired. Also, the compensation shift could be applied to adjust the X-axis component of the positional shifts instead of the Y-axis component.

Figure 15:
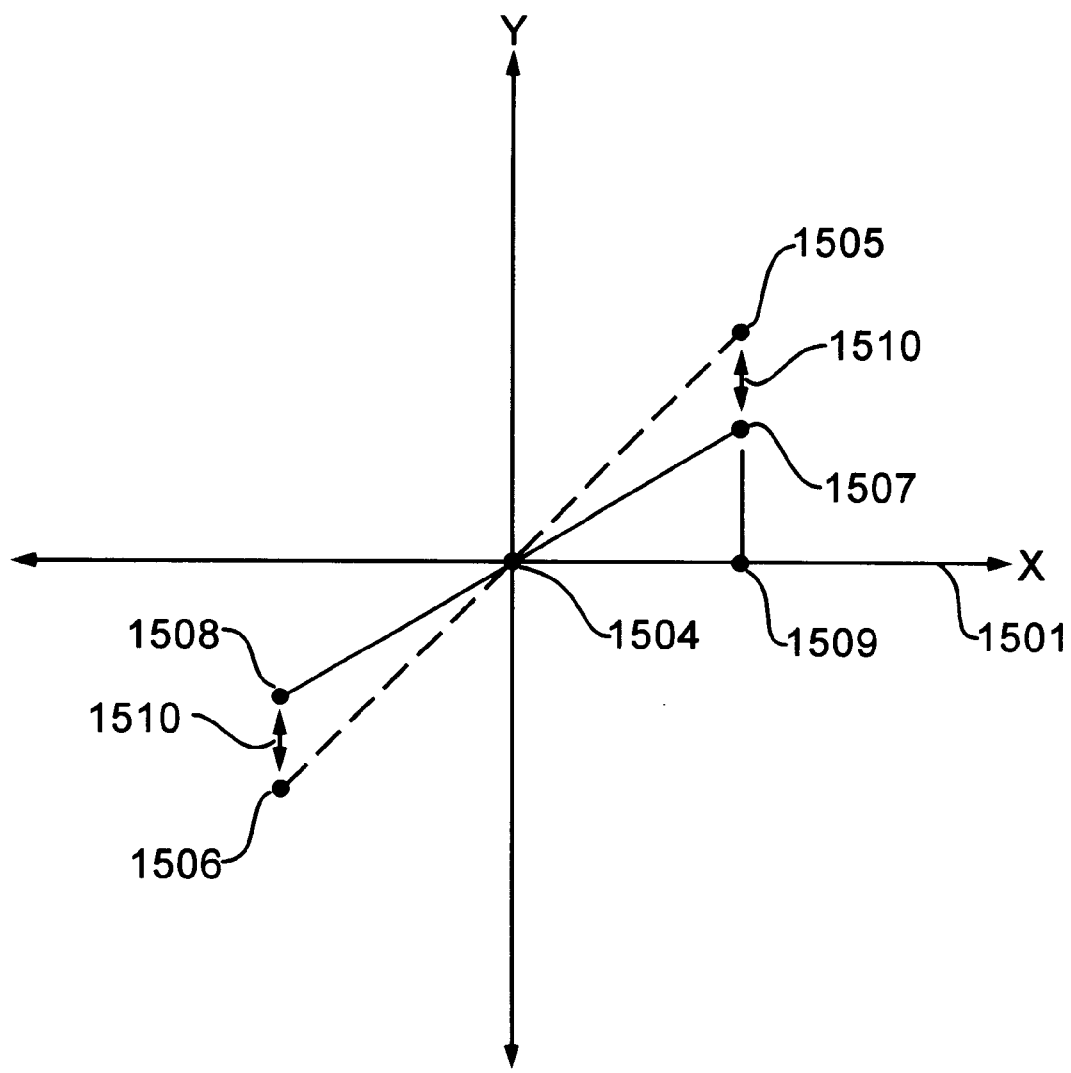
FIG. 15 illustrates the difference between the X and Y-axis components of positional shifts including a compensation shift.

FIG. 15 illustrates the effect of the compensation shift. Points 1505 and 1506 represent first and second exposure positions shifted relative to the area-centroid 1504 of the feature to be printed, but without a compensation shift. The distance between area-centroid 1504 and point 1505 can be resolved into distances along the X and Y axes (of coordinate system 1501) having equal magnitudes. By changing the magnitude of the Y-component of the positional shift (the distance between points 1509 and 1505) relative to the X-component of the positional shift (the distance between area-centroid 1504 and point 1509), it is possible to reduce or increase the critical dimension of horizontally aligned features without changing the critical dimension of vertically aligned features. Alternatively, the magnitude of the X-component of the positional shift can be changed to reduce or increase the critical dimension of vertically aligned features without affecting the horizontally aligned features.

Points 1507 and 1508 represent first and second exposure positions shifted relative to area-centroid 1504, but with a compensation shift 1510 included. The compensation shift 1510 causes the positional shift along the Y-axis to be decreased. The decreased positional shift along the Y-axis results in an increased overlap of exposed regions when the wafer is exposed while at positions 1507 and 1508 relative to the pattern transfer tool. As the overlap of exposed regions increases, the Y dimension of all printed features increases. Since the horizontally aligned features have critical dimensions aligned along the Y-axis, but not the vertically aligned features, only the critical dimension of the horizontally aligned features is increased by the compensation shift 1510. It will be appreciated that a compensation shift could alternatively be introduced to increase the Y-component of the positional shift or to increase or decrease the X-component of the positional shift.

Computing the Compensation Shift

Assume that the compensation shift is a positive value and that, as shown in FIG. 15, the first and second shifted positions 1507 and 1508 are given by:

First shift: x=a, y=a−cs,

Second shift: x=−a, y=−a+cs

In FIG. 15, distance "a" is the distance between area-centroid 1504 and 1509 and also between point 1509 and point 1505 and will typically be a few hundred nanometers at most (at least under 1 micron). Since the compensation shift is applied to equally reduce the magnitude of the Y-component of the first and second positional shifts, the critical dimension of horizontal features will be increased by twice the compensation shift. Since the purpose of the compensation shift is to reduce the systematic difference in critical dimension between vertical and horizontal features, the magnitude of the compensation shift can be computed as follows:

$$CS = \tfrac{1}{2} * \Delta_{V/HCD} = \tfrac{1}{2} * (X_{mean} - Y_{mean}) \tag{7}$$

After a process constant, K, typically ranging from 0.8 to 1.8 (and serving the same purpose as discussed in reference to equation (4)) is introduced, the expression for calculating the compensation shift becomes:

$$CS = \tfrac{1}{2} * K * \Delta_{V/HCD} \tag{8}$$

Since the vertical/horizontal CD difference is typically under 30 nm, to compensate a 30 nm vertical/horizontal CD difference the compensation shift is typically well under 100 nm and tends to range from 12 to 27 nm.

It is difficult to determine whether a given compensation shift has rendered the critical dimensions of horizontally and vertically aligned features exactly equal. This is because most scanning electron microscopes (SEMs) are unable to repeatably measure distances of less than a few nanometers. However, a compensation shift can be used to reduce the vertical/horizontal CD difference by at least 80–90%, and the resulting vertically and horizontally aligned features are said to have substantially equal critical dimensions.

Returning to FIG. 6, it is possible to express a compensation shift as a change in the angle θ. For example, if the mean difference in the critical dimension between horizontal and vertical features is D, then a compensation shift can be introduced by a first positional shift having X and Y-axis components given by: x=a, y=a−(D/2). The second positional shift would have X and Y-axis components given by: x=−a, y=−a+(D/2). The magnitude, A, of the first positional shift is equal to the magnitude of the second positional shift and is given by:

$$A = (a^2 + (a - D/2)^2)^{1/2} = (2a^2 - a*D + D^2/4)^{1/2} \tag{9}$$

The angle θ, which represents the direction of the first positional shift relative to the X-axis defined by line 631, is given by:

$$\theta = \tan^{-1}(1 - D/2a) \text{ radians} \tag{10}$$

The angle of the second positional shift is θ+π radians.

In the example above, if D is positive, the compensation shift has the effect of reducing the mean critical dimension of horizontal features to match the mean critical dimension of vertical features. If D is negative the compensation shift has the effect of increasing the mean critical dimension of horizontal features to match the mean critical dimension of vertical features. Of course, the compensation shift could also be applied to the X-axis component of the positional shifts to increase or reduce the mean critical dimension of vertical features.

Figure 16:
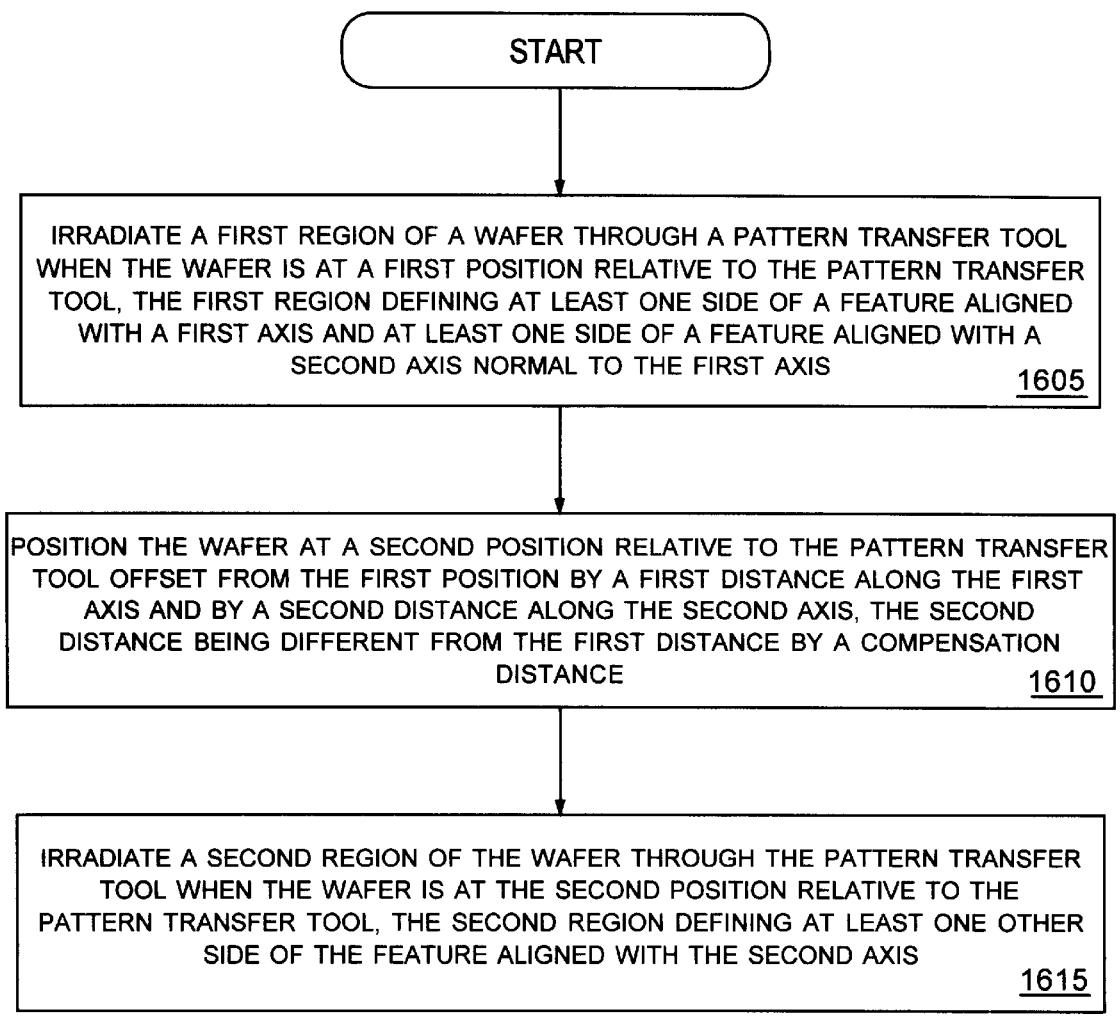
FIG. 16 illustrates a method for performing a double shift print including a compensation shift.

FIG. 16 illustrates a method for printing a plurality of horizontally and vertically aligned features having substantially equal critical dimensions. At step 1605, when the wafer is in a first position relative to the pattern transfer tool, a first region of the wafer is irradiated with radiant energy passed through the pattern transfer tool to define at least one side of a feature aligned with a first axis and to define at least one side of a feature aligned with a second axis normal to the first axis.

At step 1610, the wafer is positioned at a second position relative to the pattern transfer tool. This is accomplished either by moving the wafer or by moving the pattern transfer tool. The second position is offset from the first position by a first distance along the first axis and by a second distance along the second axis. The second distance differs from the first distance by a compensation distance. The compensation distance is chosen to reduce the systematic difference between the critical dimensions of features aligned with the first axis and features aligned with the second axis.

At step 1615, when the wafer is at the second position, the wafer is irradiated through the pattern transfer tool to define at least one other side of the feature aligned with the first axis and at least one other side of the feature aligned with the second axis. In an apparatus which allows the second position to be reached by extremely straight motion of either the wafer or the pattern transfer tool, the irradiation of steps 1605 and 1615 may be effectuated by activating a radiant energy source while the wafer is in the first position relative to the pattern transfer tool, then moving the wafer or pattern transfer tool to establish the second relative position while the radiant energy source remains activated.

Apparatus for Performing a Double Shift Print

Figure 7:
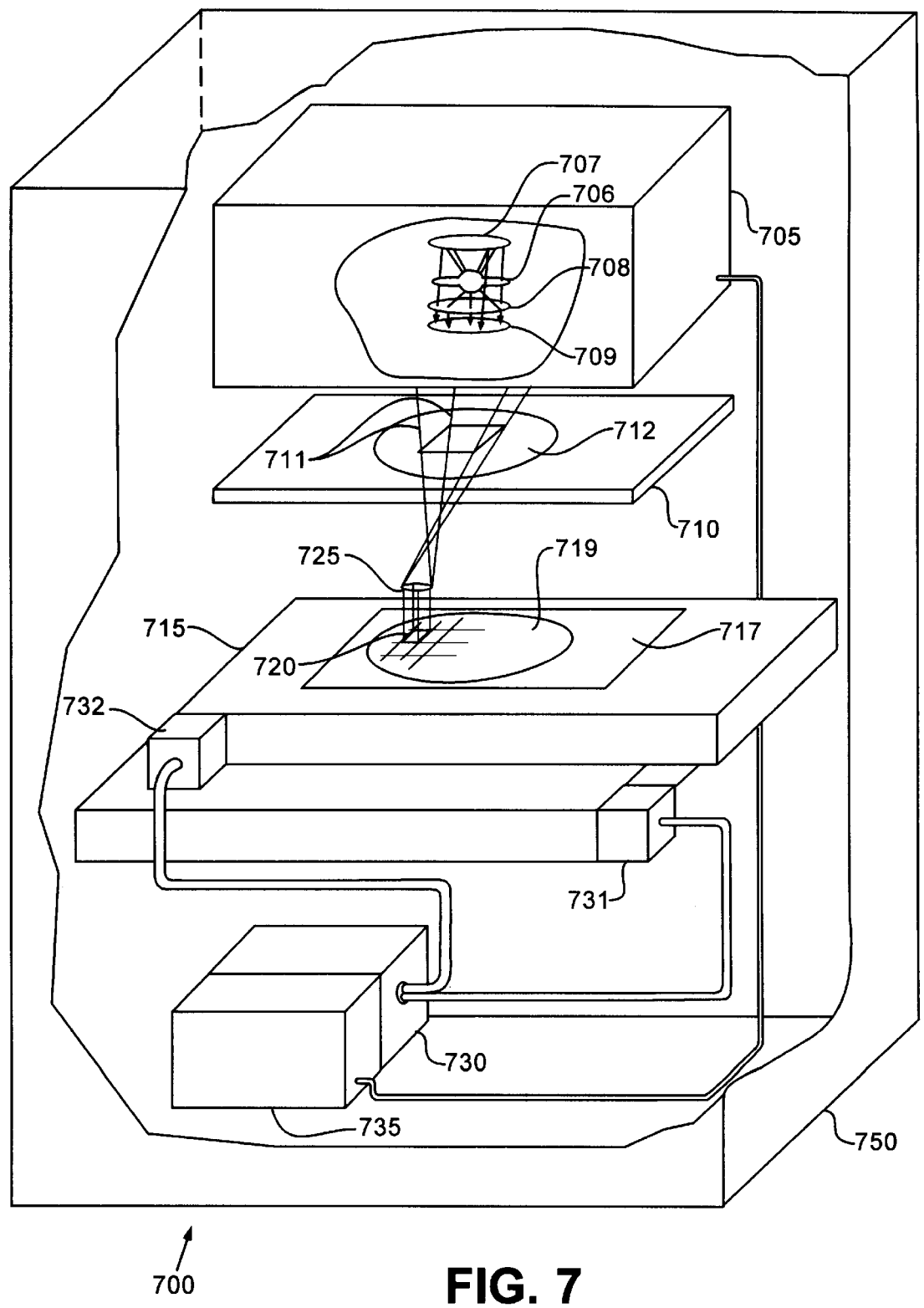
FIG. 7 depicts an apparatus for printing a feature on a semiconductor wafer.

FIG. 7 depicts an apparatus 700 for performing the method of the present invention. Apparatus 700 includes a source mount 705 to which a radiant energy source 706 is mounted, pattern mount 710 to which pattern transfer tool 712 is mounted, objective lens 725 mounted to a lens mount (not shown), stage 715 including wafer mount 717 to which wafer 719 is mounted, stage positioner 730 coupled to the stage 715 and exposure controller 735 coupled to the radiant energy source 706. Source mount 705, pattern mount 710, lens mount (not shown) for objective lens 725, stage 715, stage positioner 730 and exposure controller 735 are connected to frame 750.

In one embodiment of the present invention, radiant energy source 706 is a mercury-vapor lamp and source mount 705 includes a mirror 707 for back reflecting light rays emitted from source 706, a filter 708 for filtering radiant energy having wavelengths other than a selected irradiating wavelength, and a condensing lens 709 for focusing the filtered radiant energy onto a reticle. Activation of radiant energy source 706 is controlled by exposure controller 735. Exposure controller 735 includes a sensor (not shown) disposed within the path of radiant energy emitted by the radiant energy source to allow feedback-controlled activation of the radiant energy source 706. Since the output intensity of a mercury-vapor lamp varies over time, feedback-controlled activation is necessary to ensure that the radiant energy dosage received by a wafer is sufficient to exceed the threshold dosage (also known as the critical dosage) needed to bring about complete solubility of the exposed photoresist.

Pattern mount 710 is disposed relative to the source mount 705 so that radiant energy, depicted by lines 711, from the radiant energy source 706 passes through pattern transfer tool 712.

Stage 715 is positioned relative to pattern mount 710, objective lens 725 and source mount 705 so that radiant energy from radiant energy source 707 passing through pattern transfer tool 712 is focused on the surface of wafer 719 by objective lens 725. In the preferred embodiment of the present invention, lens 725 reduces the size of the reticle image transferred to the wafer by a factor of five or ten. Stage positioner 730 includes actuators 731 and 732 coupled to stage 715 for moving stage 715, and therefore wafer 719, to various positions relative to pattern transfer tool 712. Stage positioner 730 receives feedback from a position sensing device, such as a laser interferometer (not shown), so that stage 715 can be precisely positioned.

In one embodiment of the present invention, stage positioner 730 is configured to move the wafer 719 in a pattern relative to a stationary reticle 712 so as to position the wafer 719 for each print of the double shift print. The sequence of positions to which the wafer is moved may be determined by either hard-wired logic or a programmed processor comprised by stage positioner 730. In either case, stage positioner 730 positions stage 715 at a first position so that a first region of wafer die 720 can be irradiated and then at a second position so that a second region of wafer die 720 can be irradiated. As discussed above, the first and second regions of wafer die 720 each partially define features being printed within die 720. Also, as discussed above, a compensation shift may be introduced to reduce a systematic critical dimension difference between horizontally and vertically aligned features. In that case, the second position is offset from the first position by a first distance along a first axis and by a second distance along a second axis, the second distance being different from the first distance by a compensation distance. After the second region of wafer die 720 has been irradiated, the double shift print is completed and stage positioner 730 positions stage 715 to process the next die.

In order to coordinate the positioning of stage 715 and activation of radiant energy source 705, the stage positioner 730 may be configured to signal exposure controller 735 to activate the radiant energy source 706 when the wafer 719 is in position for exposure. Alternatively, another controller (not shown) may be provided to coordinate the operation of the stage positioner 730 and the exposure controller 735. Generally, any configuration of control components which can coordinate the operation of stage 715 and radiant energy source 706 is within the spirit and scope of the present invention.

Motion Required to Establish Positional Shifts

Figure 8:
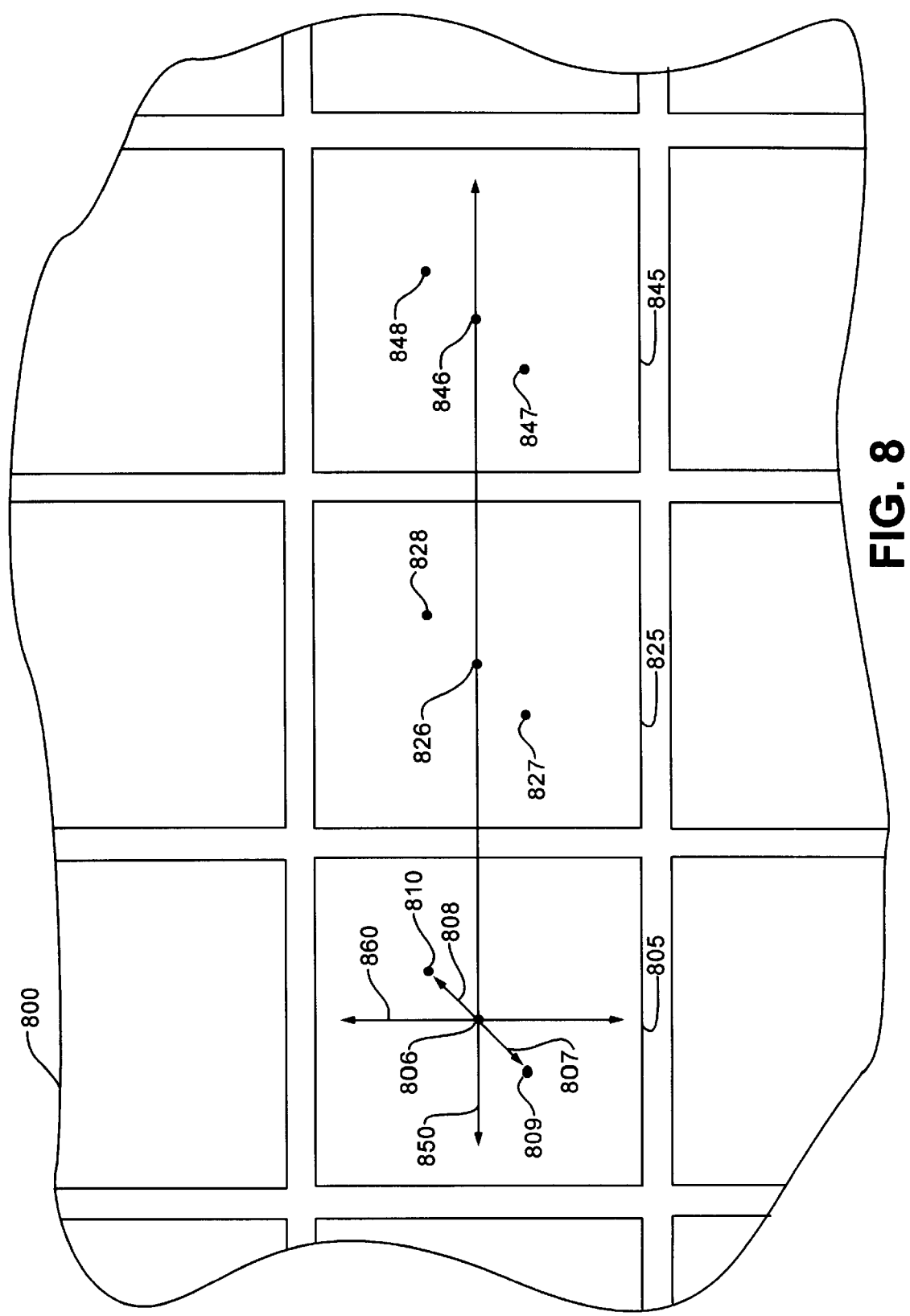
FIG. 8 depicts a portion of a semiconductor wafer to illustrate the sequence of motions involved in making a double shift print.

FIG. 8 depicts a portion of a semiconductor wafer 800 for the purpose of illustrating the sequence of motions involved in making a double shift print using the apparatus of FIG. 7. In a standard step and repeat process, wafer die 805 would be positioned so that its area-centroid 806 is optically aligned with the center of a reticle pattern (not shown). For reference, this is referred to as a "standard alignment" and the wafer 800 is said to be positioned at point 806. Die 805 would then be exposed and the wafer 800 stepped to area-centroid 826 of die 825 to repeat the standard alignment. Die 825 would then be exposed and the wafer 800 stepped to point 846, and so forth.

To make a double shift print on die 805 using the apparatus of FIG. 7, the wafer is first positioned at point 809 to establish a first positional shift having a magnitude (exaggerated for clarity) and direction indicated by vector 807. The die 805 is irradiated, then the wafer moved to point 810 to establish a second positional shift having a magnitude and direction indicated by vector 808. Note that if the magnitude of the first positional shift is $A_1$, the magnitude of the second positional shift is $A_2$, and the angle between the two positional shifts is $\pi$ radians, then the wafer 800 must be moved by a distance $A_1+A_2$ relative to the reticle to reach position 810 from position 809. It should be clear, therefore, that the distance, $A_1+A_2$, traveled by the stage (or reticle) to establish the second positional shift is not the same as the magnitude of the second positional shift, $A_2$.

After a second print at position 810, the wafer 800 is moved to position 827 to establish a first positional shift from standard alignment point 826 and the process repeated. Thus, wafer 800 is moved relative to the reticle to the sequence of positions 809, 810, 827, 828, 847 848, and so forth. Again, the positional shifts indicated by points 809, 810, 827, 828, 847 and 848 have been exaggerated for clarity. It will be appreciated that other sequences of positions might be used without departing from the spirit and scope of the present invention. For example, in the preferred embodiment of the present invention the sequence of exposure positions is chosen to minimize the number of stage direction changes by making a first shifted print on each wafer die (e.g., sequencing through points 808, 828, 848 . . . ) in a given row before returning to make a second shifted print on the same row of die (e.g., sequencing through points 847, 827, 807). In another embodiment, the sequence of positions might be chosen to minimize travel distance between successive exposure points.

Directionality of Positional Shifts

For the purpose of describing the directionality of the positional shifts of a double shift print, it is helpful to define a Cartesian coordinate system on wafer 800 of FIG. 8. A line 850 drawn through area-centroids 806 and 826 can be considered to define the X-axis of the coordinate system and a line 860 normal to line 850 to define the Y-axis of the coordinate system.

The direction of vectors 807 and 808 is significant because features printed on a wafer are generally aligned with at least one of the axes defined by lines 850 and 860. If some features are aligned with the X-axis (line 850) and others with the Y-axis, then, in order to define opposing sides of each feature with a double shift print, the direction of the positional shifts must be transverse to both axes 850 and 860. This is accomplished in the preferred embodiment by shifting the wafer position in directions having substantially equal X-axis and Y-axis components. Of course, a compensation shift, as described above, may be introduced to correct for systematic differences between the critical dimensions of X-axis aligned and Y-axis aligned features.

Based on the foregoing, it will be appreciated that if features to be printed on a wafer die are aligned exclusively with either the X-axis (line 850) or the Y-axis, then it is necessary only that the positional shifts of the double shift print be transverse to the axis of alignment. For example, if all features to be printed are aligned with the Y-axis, positional shifts along the X-axis alone will suffice to provide the double shift print effect.

Translating-Reticle Embodiment

Figure 9:
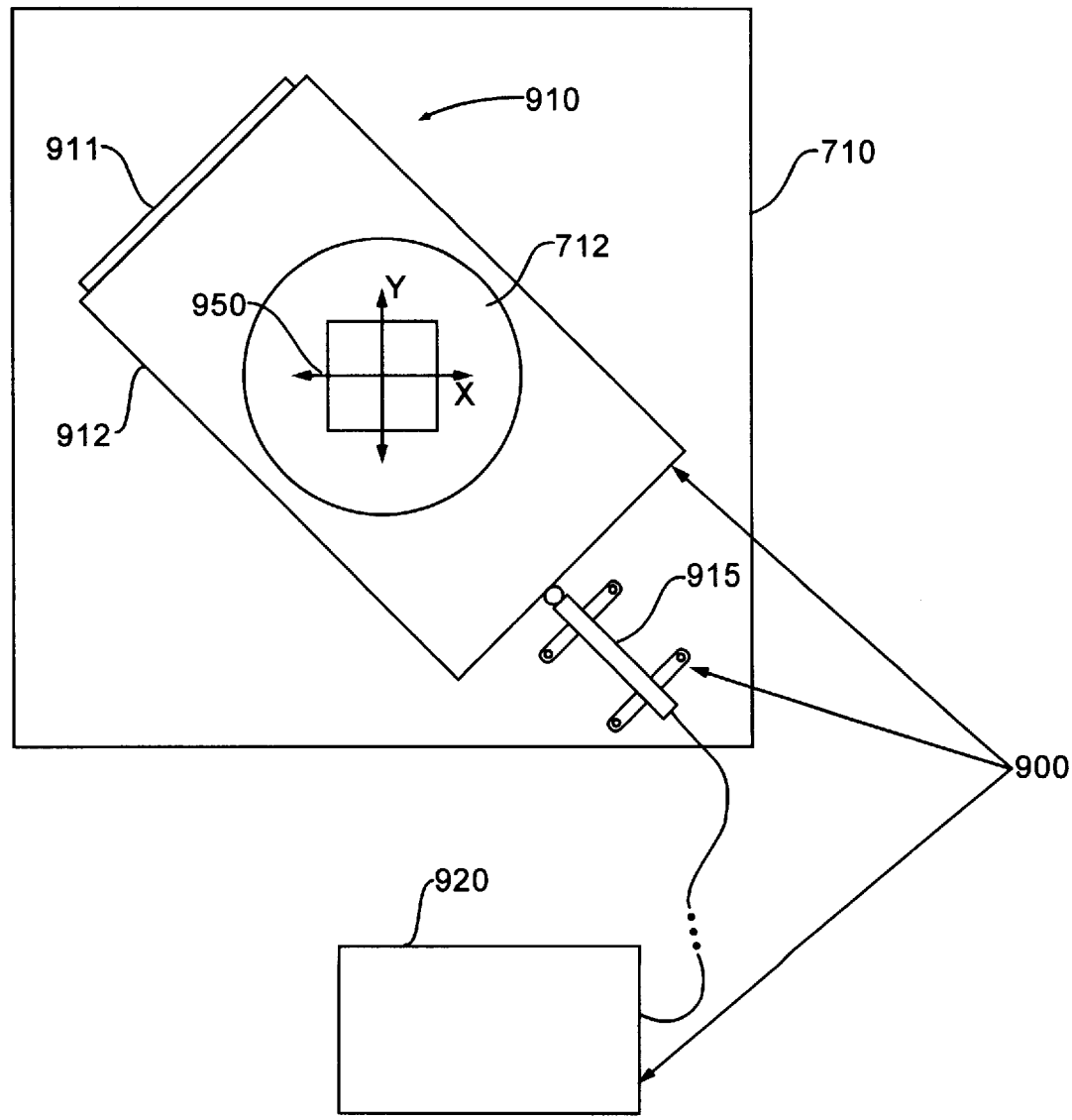
FIG. 9 depicts a pattern transfer tool actuator.

FIG. 9 depicts a pattern transfer tool actuator 900 that can be included in the apparatus of FIG. 7 to provide an alternative apparatus for performing the double shift print of the present invention. Pattern transfer tool actuator 900 includes a stage 910 for receiving a reticle 712 (or mask), a drive mechanism 915 such as a piezoelectric crystal or a voice coil, and a drive controller 920 for controlling the drive mechanism 915. The stage 910 includes a base 911 adjustably connected to pattern mount 710 and a table 912 movably connected to the base 911. The adjustable connection of base 911 to pattern mount 710 allows the direction of stage travel to be adjusted to introduce a compensation shift (discussed above), if necessary. The table 912 and base 911 of stage 910 both include openings so that radiant energy may be passed through the reticle 712 to irradiate a semiconductor wafer below (not shown).

It will be appreciated that the function of drive controller 920 may be incorporated into stage positioner 730 of FIG. 7. Further, though not shown, a laser interferometer or high-resolution positioning encoder may be used to provide position feedback to the drive controller 920.

When the apparatus 700 of FIG. 7 is modified to include pattern transfer tool actuator 900, the sequence of stage positions required to accomplish a double shift print is changed. Instead of moving the stage to reposition wafer 719 after the first print of the double shift print, pattern transfer tool actuator 900 moves the reticle relative to pattern mount 710 by an amount necessary to achieve the second positional shift of the double shift print. In this way, stage positioner 730 may be configured to move wafer 719 through a sequence of positions with one wafer die being double shift printed at each stage position. Of course, each of the sequence of positions would be a position offset from the standard alignment, as described above, but otherwise, the sequence of stage motions is identical to that required for a standard step and repeat process.

As shown in FIG. 9, stage 910 can be mounted to allow translation of table 912 (and therefore reticle 712) in a direction transverse to both the X and Y axes of X-Y coordinate system 950. This means that the path of motion between the first and second shifted positions of a double shift print can be as straight and well controlled as the motion of table 912. Since the distance traveled by table 912 will typically be well under 500 nm, an extremely straight and repeatable motion profile can be achieved. This is advantageous because it allows the reticle to be moved during the exposure of wafer 719. The radiant energy source 706 is activated while the wafer 719 is at the first shifted position relative to the reticle, and then the reticle is moved while activation of the radiant energy source 706 is maintained. In this way, the first exposure of wafer 719 at the first shifted position and the second exposure of wafer 719 at the second shifted position are both achieved in a single continuous exposure. Since the radiant energy source does not have to be deactivated (or shuttered) between the two exposures, and since the settling time of the single-axis stage 910 is less than that required after motion of the two-axis stage 715, time is saved and throughput increased.

Method for Performing a Double Shift Print with Translating Reticle

Figure 10:
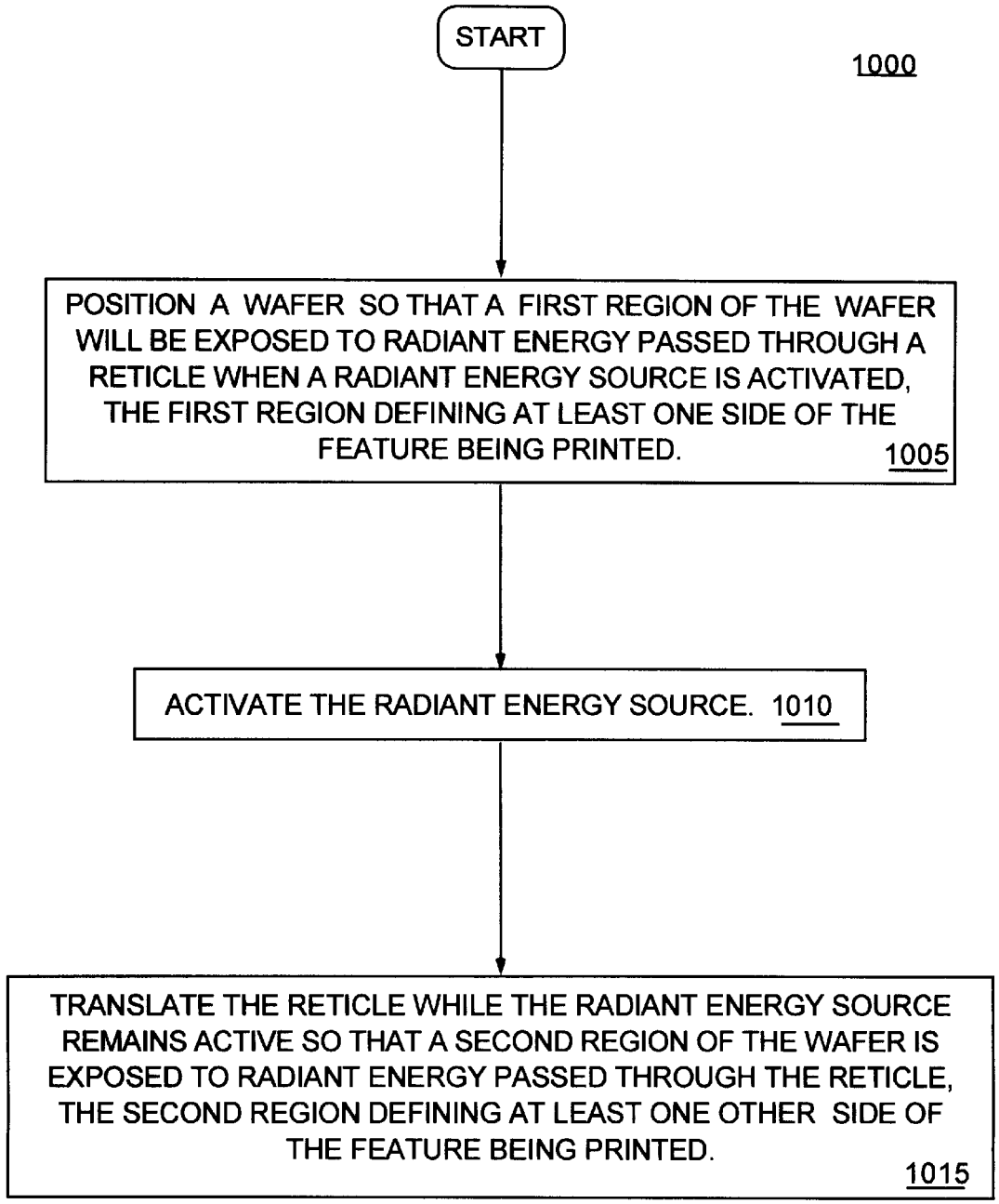
FIG. 10 illustrates a method for performing a double shift print in an apparatus including a pattern transfer tool actuator.

FIG. 10 illustrates a method 1000 for performing a double shift print in an apparatus including the reticle-translating mechanism described above. At step 1005, the wafer is positioned relative to the pattern transfer tool so that a first region of the wafer will be exposed to radiant energy passed through the reticle when a radiant energy source is activated. In the preferred embodiment, step 1005 is accomplished by positioning a stage to which the wafer is mounted. In any case, the first region defines at least one side of the feature being printed. At step 1010, the radiant energy source is activated. Then, at step 1015, while the radiant energy source remains activated, the reticle is translated to expose a second region of the wafer to radiant energy passed through the reticle. The second region defines the remaining sides of the feature being printed. Thus, according to method 1000, the step of exposing the first wafer region (1005) and the step of exposing the second wafer region (1015) are accomplished with a single activation (or single shutter opening) of a radiant energy source.

Apparatus for Printing with Dual-Reticle Pattern Transfer Tool

Figure 11:
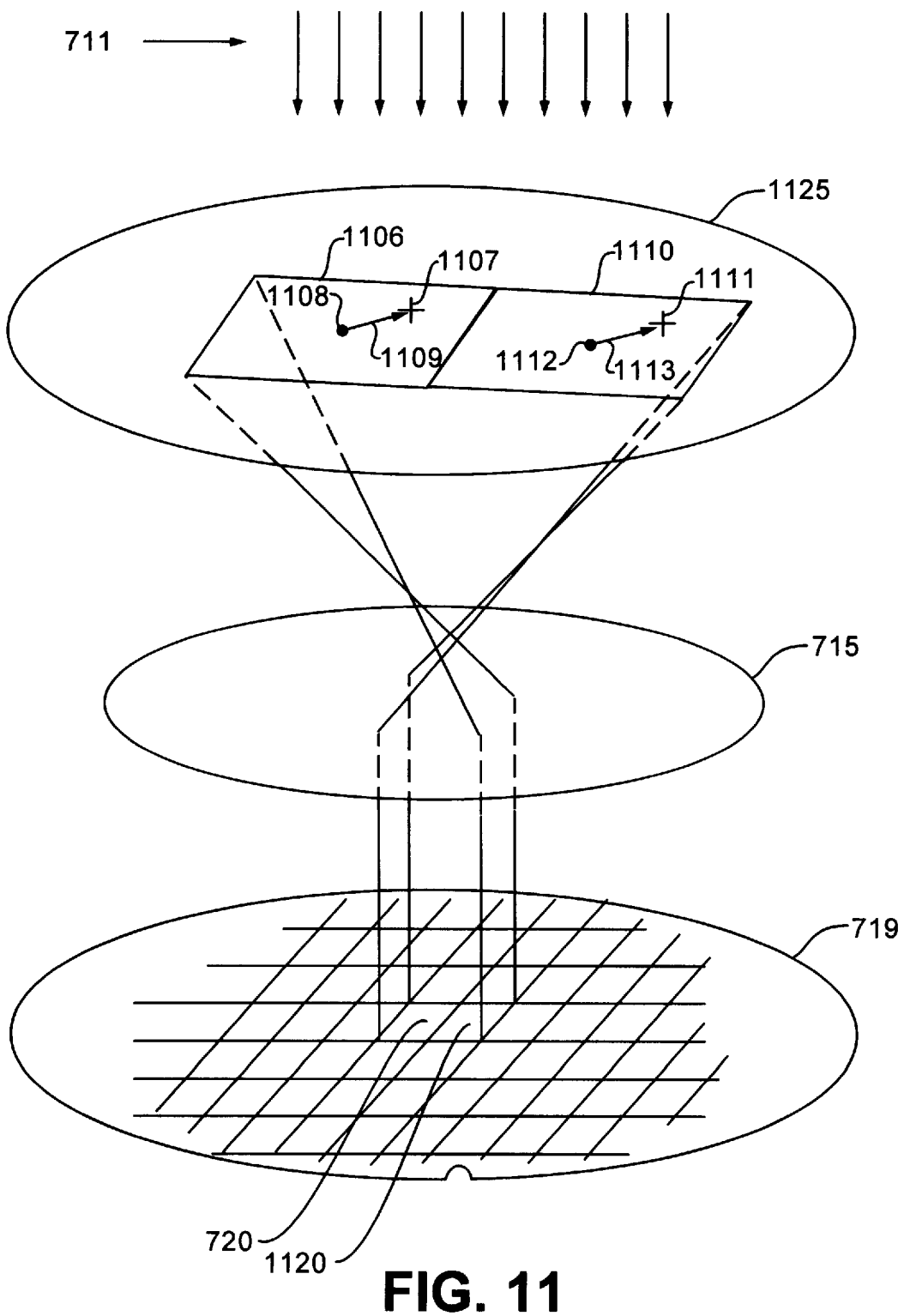
FIG. 11 depicts a pattern transfer tool having two reticle patterns thereon.

FIG. 11 depicts a pattern transfer tool 1105 having a two reticles (1106 and 1110) thereon. The patterns on the two reticles 1106 and 1110 are essentially identical except that they are offset from one another so that when a die is exposed to radiant energy passed through one of the reticles (1106 or 1110) and then to radiant energy passed through the other of the reticles, a double shift print is achieved. The two reticles 1106 and 1110 may either be part of an integrated whole or individual units.

The offset between the respective images on reticles 1106 and 1110 can be determined by locating the same feature in the pattern of each, determining each feature's distance from a fixed reference in the respective reticle, and comparing the two distances. For example, Vector 1109 represents the distance between an arbitrary feature 1107 in the pattern of reticle 1106 and the center 1108 of reticle 1106. Similarly, vector 1113 represents the distance between the same feature 1111 in the pattern of reticle 1110 and the center 1112 of reticle 1110. The difference between vectors 1109 and 1113 represents the offset between the respective patterns on reticles 1106 and 1110.

Figure 12:
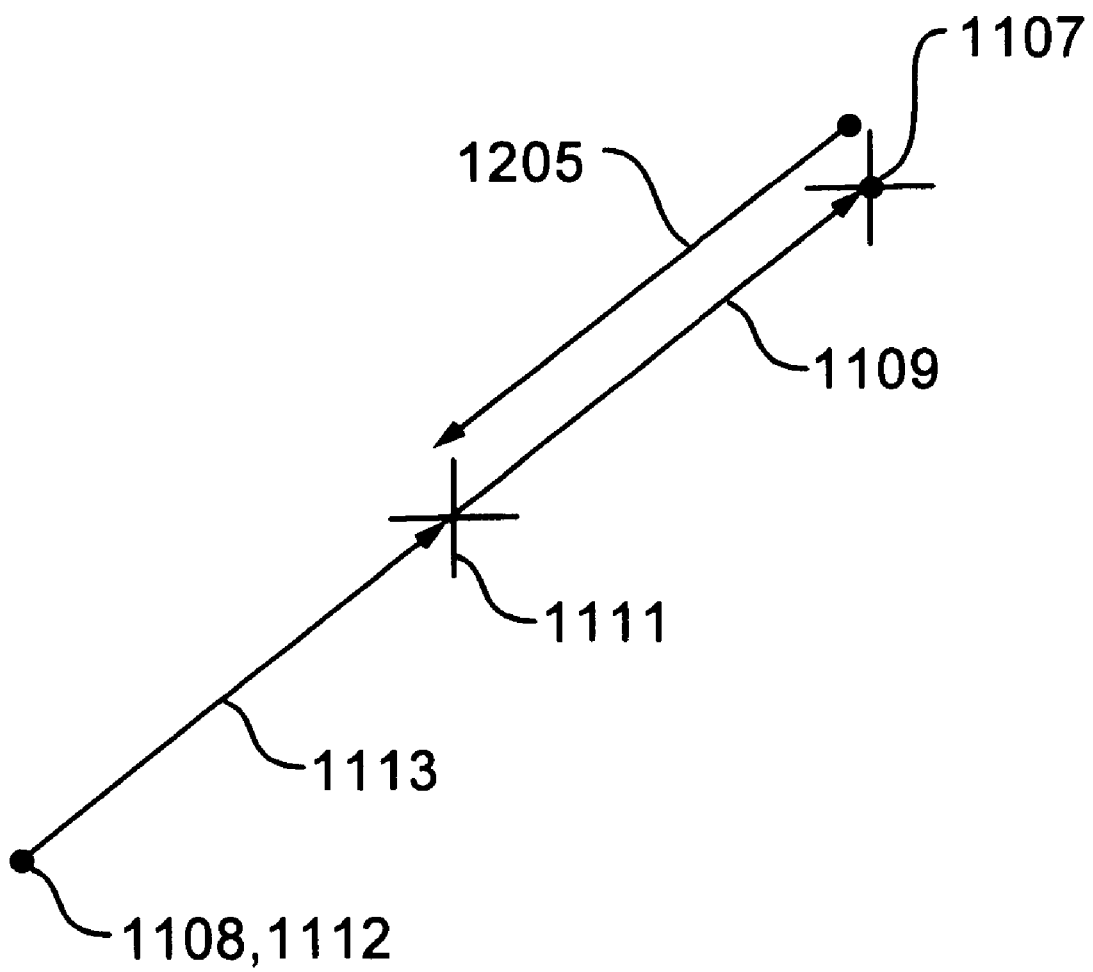
FIG. 12 illustrates the offset between the respective images on the reticle patterns of a dual-reticle pattern transfer tool.

In FIG. 12, reticle 1106 has been superimposed on reticle 1110 to illustrate the offset between their respective patterns. By superimposing the reticles so that their centers 1108 and 1112 are coincident, it becomes clear that features 1107 and 1111 are offset from one another by the difference between vectors 1109 and 1113. This difference is represented by vector 1205. In the preferred embodiment, the images on reticle patterns 1106 and 1110 are each offset from the standard alignment discussed above by a magnitude equal to one-half the magnitude of vector 1205, and in directions opposite one another.

As illustrated in FIG. 11, pattern transfer tool 1105 can be used to expose two die (720 and 1120) in a single exposure. As mentioned above, the offset between the images on the two reticle patterns 1106 and 1110 can be chosen so that after a die has been exposed through reticle pattern 1106, the die can then be exposed through reticle pattern 1110 to achieve a double shift print. That is, the exposure of a wafer die to radiant energy 711 passed through reticle pattern 1106 (and focused by lens 715) constitutes a first shifted print, and the exposure of the die through reticle pattern 1110 constitutes a second shifted print. With regard to a rectangular feature printed on the die, two sides of the feature are defined by the exposure through reticle pattern 1106 and the other two sides of the feature are defined by the exposure through reticle pattern 1110.

A primary advantage achieved by the dual-reticle pattern transfer tool is that the number of motions necessary to double shift print a complete wafer, die by die, can be cut nearly in half. This is because, except in the case of perimeter die, two die are exposed after every repositioning step.

Figure 13:
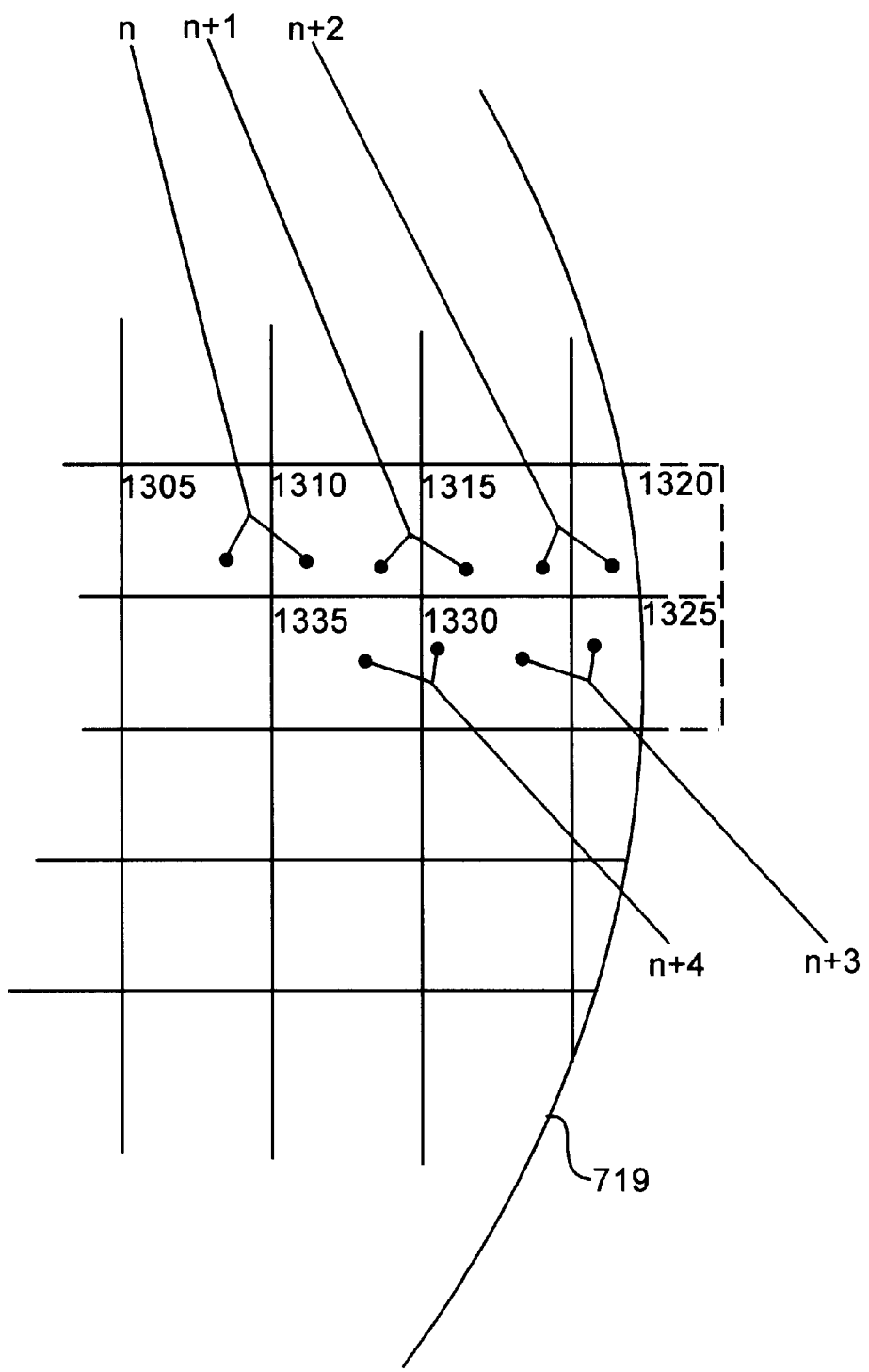
FIG. 13 illustrates the stepping sequence used to expose wafer die in an apparatus including dual-reticle pattern transfer tool.

FIG. 13 illustrates the stepping sequence used to expose wafer die when a dual-reticle pattern transfer tool is employed. Assume that n−1 exposures have already taken place and that die 1305 and 1310 are exposed in the $n^{th}$ exposure. A first shifted print was performed on die 1305 in the previous exposure (n−1, not shown), so that, when the second shifted print occurs at exposure n, a double shift print is achieved on die 1305. Similarly, since a first shifted print is performed on die 1310 at exposure n, repositioning the wafer and exposing die 1310 and 1315 in exposure n+1 achieves a double shift print on die 1310. Die 1315 is a perimeter die so that in exposure n+2, die 1315 is exposed through one of the two reticles of the dual-reticle pattern transfer tool to effect the second shifted print of a double shift print. During exposure step n+2, the other of the two reticles is not aligned over a die, but rather over unused region 1320. Thus, to double shift print a perimeter die involves at least one exposure when one of the two reticles is not aligned over a die. This situation occurs again in exposure n+3 when die 1330 is exposed through one of the two reticle patterns to effect a first shifted print. During exposure n+3, the other of the two reticle patterns is aligned over unused region 1325. The double shift print on die 1330 is then completed during exposure n+4, the same exposure that produces a first shifted print on die 1335. Thus, the total number of motions required to double shift print an entire wafer using a dual-reticle pattern transfer tool is equal to the total number of die plus the number of perimeter die. Compared to the apparatus of FIG. 7, the number of motions is reduced by the number of wafer die less the number of perimeter die. The net result is higher throughput.

A method and apparatus for printing a feature having a reduced critical dimension on a semiconductor wafer are thus described. While the present invention has been described in particular embodiments and through particular examples, the present invention should not be construed as limited by such embodiments and examples, but rather construed according to the following claims.

What is claimed is:

1. A method for printing a plurality of features in a resist layer on a substrate, said method comprising:

irradiating a first region of the substrate through a pattern transfer tool when the substrate is at a first position relative to the pattern transfer tool, the first region defining a first side of each of the plurality of features;

positioning the substrate at a second position relative to the pattern transfer tool, the second position being offset from the first position by a first distance along a first axis and by a second distance along a second axis normal to the first axis, the second distance being different from the first distance by a compensation distance; and irradiating a second region of the substrate through the pattern transfer tool when the substrate is at the second position relative to the pattern transfer tool, the second region defining a second side of each of the plurality of features.

2. The method of claim 1 further comprising determining the compensation distance based on a difference between critical dimensions of features aligned with the first axis and critical dimensions of features aligned with the second axis.

3. The method of claim 1 further comprising selecting the compensation distance to render critical dimensions of features aligned with the first axis substantially equal to critical dimensions of features aligned with the second axis.

4. The method of claim 1 wherein positioning the substrate at a second position relative to the pattern transfer tool comprises moving the substrate.

5. The method of claim 1 wherein said compensation distance is less than 100 nanometers.

6. The method of claim 1 wherein the first distance is less than one micron and the second distance is less than one micron.

7. The method of claim 1 wherein positioning the substrate at a second position relative to the pattern transfer tool comprises moving the pattern transfer tool.

8. The method of claim 1 wherein irradiating a second region comprises defining a second side of one of the plurality of features opposite the first side of the one of the plurality of features.

9. The method of claim 1 wherein irradiating a first region comprises defining one or more sides of each of the plurality of features in addition to the first side, and wherein irradiating the second region comprises defining one or more sides of each of the plurality of features in addition to the second side, the first side, the one or more sides in addition to the first side, the second side and the one or more sides in addition to the second side collectively defining a respective perimeter of each of the plurality of features.

10. The method of claim 1 wherein irradiating a first region of the substrate comprises exposing a first region of the resist layer on the substrate to a radiant energy dosage greater than a threshold dosage of the resist layer and wherein irradiating a second region of the substrate comprises exposing a second region of the resist layer to a radiant energy dosage greater than the threshold dosage of the resist layer.

11. The method of claim 10 wherein exposing the first region of the resist layer to a radiant energy dosage greater than a threshold dosage comprises inducing a chemical reaction in the first region of the resist layer.

12. The method of claim 11 wherein inducing a chemical reaction in the first region of the resist layer comprises rendering the first region of the resist layer soluble in a developing solvent.

13. The method of claim 1 wherein irradiating a first region of the substrate through a pattern transfer tool comprises exposing the first region of the substrate to radiant energy through a reticle.

14. The method of claim 1 wherein irradiating a first region comprises activating a radiant energy source when the substrate is at the first position, and wherein irradiating a second region comprises maintaining activation of the radiant energy source as the substrate is positioned at the second position relative to the pattern transfer tool.

* * * * *